United States Patent
Lee et al.

(10) Patent No.: US 7,940,547 B2
(45) Date of Patent: May 10, 2011

(54) RESISTIVE MEMORY DEVICE FOR PROGRAMMING RESISTANCE CONVERSION LAYERS AND METHOD THEREOF

(75) Inventors: Seung-hoon Lee, Seoul (KR);
Yoon-dong Park, Yongin-si (KR);
Young-soo Park, Seoul (KR);
Myung-jae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 46 days.

(21) Appl. No.: 12/379,158

(22) Filed: Feb. 13, 2009

(65) Prior Publication Data

US 2009/0225583 A1 Sep. 10, 2009

(30) Foreign Application Priority Data

Mar. 5, 2008 (KR) .................. 10-2008-0020583

(51) Int. Cl.
*G11C 11/00* (2006.01)
*G11C 17/00* (2006.01)

(52) U.S. Cl. .................. 365/148; 365/100; 365/163

(58) Field of Classification Search .............. 365/148
See application file for complete search history.

(56) References Cited

U.S. PATENT DOCUMENTS

| | | | | |
|---|---|---|---|---|
| 6,141,241 A * | 10/2000 | Ovshinsky et al. | ............ | 365/163 |
| 6,798,685 B2 * | 9/2004 | Rinerson et al. | ............ | 365/100 |
| 7,247,357 B2 * | 7/2007 | Shiba et al. | ............ | 428/1.51 |
| 7,327,602 B2 * | 2/2008 | Kostylev et al. | ............ | 365/163 |
| 7,382,647 B1 * | 6/2008 | Gopalakrishnan | ............ | 365/163 |
| 7,511,986 B2 * | 3/2009 | Horii et al. | ............ | 365/148 |
| 7,525,832 B2 * | 4/2009 | Muraoka et al. | ............ | 365/148 |
| 7,577,022 B2 * | 8/2009 | Muraoka et al. | ............ | 365/159 |
| 7,646,625 B2 * | 1/2010 | Philipp et al. | ............ | 365/148 |
| 7,697,317 B2 * | 4/2010 | Shimaoka et al. | ............ | 365/148 |
| 2004/0160818 A1 * | 8/2004 | Rinerson et al. | ............ | 365/171 |
| 2004/0228163 A1 * | 11/2004 | Khouri et al. | ............ | 365/154 |
| 2004/0258866 A1 * | 12/2004 | Shiba et al. | ............ | 428/35.7 |
| 2006/0050549 A1 * | 3/2006 | Adachi et al. | ............ | 365/148 |
| 2006/0077705 A1 * | 4/2006 | Kostylev et al. | ............ | 365/163 |
| 2006/0171199 A1 * | 8/2006 | Ju | ............ | 365/171 |
| 2007/0008768 A1 * | 1/2007 | Daley | ............ | 365/148 |
| 2009/0003035 A1 * | 1/2009 | Philipp et al. | ............ | 365/148 |
| 2009/0067214 A1 * | 3/2009 | Mitani et al. | ............ | 365/148 |
| 2009/0067215 A1 * | 3/2009 | Muraoka et al. | ............ | 365/148 |
| 2009/0147565 A1 * | 6/2009 | Lowrey | ............ | 365/163 |
| 2009/0207647 A1 * | 8/2009 | Maejima et al. | ............ | 365/148 |
| 2010/0002490 A1 * | 1/2010 | Mitani et al. | ............ | 365/148 |
| 2010/0027320 A1 * | 2/2010 | Muraoka et al. | ............ | 365/148 |

* cited by examiner

*Primary Examiner* — Son L Mai

(74) *Attorney, Agent, or Firm* — Harness, Dickey & Pierce, P.L.C.

(57) ABSTRACT

Example embodiments provide a method for programming a resistive memory device that includes a resistance conversion layer. The method may include applying multiple pulses to the resistance conversion layer. The multiple pulses may include at least two pulses, where a magnitude of each pulse of the at least two pulses is the same. A first pulse of the at least two pulses may be applied on one side of the resistance conversion layer and a second pulse of the at least two pulses may be applied on the other side of the resistance conversion layer. The applying step may be performed during a set programming operation or a reset programming operation. A resistive memory device for programming a resistance conversion layer may include a first and second electrode, a lower structure, and the resistance conversion layer coupled between the first and second electrodes. The resistance conversion layer may be configured to receive multiple pulses, where the multiple pulses include at least two pulses having the same magnitude.

24 Claims, 9 Drawing Sheets

RESISTIVE MEMORY DEVICE FOR PROGRAMMING RESISTANCE CONVERSION LAYERS AND METHOD THEREOF

PRIORITY STATEMENT

This U.S. non-provisional patent application claims the benefit of Korean Patent Application No. 10-2008-0020583, filed on Mar. 5, 2008, in the Korean Intellectual Property Office, the disclosure of which is incorporated herein in its entirety by reference.

BACKGROUND

1. Field

Example embodiments relate to a resistive memory device and method for programming a resistance conversion layer, for example, the resistive memory device and method may stabilize a dispersion of voltages in the resistive memory device.

2. Description of the Related Art

Conventional resistive random access memories (RRAMs) may include a transition metal oxide as a data storage layer. The transition metal oxide may include a resistance changing property, which may be a resistance value that changes according to an applied voltage. The conventional RRAM may include a 1S (switch)-1R (resistance) structure having a switching structure, and a resistance conversion layer. The switch may include a diode, a transistor, or a varistor. The resistance conversion layer may include a transition metal oxide. The transition metal oxide may include a Ni oxide material, a Ti oxide material, a Cu oxide material, or a Co oxide material, for example.

A conventional method for programming a conventional RRAM is described below. A first electric pulse may be applied to the resistance conversion layer in order to program the RRAM to be in a set state. Accordingly, a current path, through which electric current flows, may be formed in the resistance conversion layer. Therefore, a resistance of the resistance conversion layer may become low. In addition, a second electric pulse may be applied to the RRAM in order to program the RRAM to be in a reset state. Accordingly, the current path in the resistance conversion layer may be removed, and the resistance of the resistance conversion layer may increase. In the conventional RRAM, a single pulse may be used in a programming operation. However, in an array structure of the RRAM, because not all of the resistances of memory cells in the set states and the reset states are equal to each other, some of the memory cells may not operate or operate normally.

SUMMARY

Example embodiments provide a method for programming a resistive memory device that includes a resistance conversion layer. The method may include applying multiple pulses to the resistance conversion layer. The multiple pulses may include at least two pulses, where a magnitude of each pulse of the at least two pulses is the same. A first pulse of the at least two pulses may be applied on one side of the resistance conversion layer and a second pulse of the at least two pulses may be applied on the other side of the resistance conversion layer. The applying step may be performed during a set programming operation or a reset programming operation.

The method may further include setting the magnitude of the multiple pulses, a pulse width of the multiple pulses, and a number of pulse applications before applying the multiple pulses to the resistance conversion layer. The set number of pulse application may be between 2 and 10.

The method may further include comparing the number of applied multiple pulses with the number of pulse applications, and applying the multiple pulses again to the resistance conversion layer if the number of applied multiple pulses is not equal to the set number of pulse applications. The method may further include terminating the programming operation of the number if applied multiple pulses is equal to the set number of pulse applications. The method may further include adjusting the pulse width of the multiple pulses by increasing the pulse width by a set amount after the multiple pulses are applied to the resistance conversion layer.

The method may further include verifying a programming result of the resistance conversion layer if the number of applied multiple pulses is equal to the set number of pulse applications. The verifying the programming result of the resistance conversion layer may include comparing a resistance of the resistance conversion layer with reference resistances of the resistance conversion layer in a set state and a reset state, and generating a verification pulse when the programming result is verified. The set state may be verified if the resistance of the resistance conversion layer is lower than the reference resistance in the set state, and the reset state may be verified if the resistance of the resistance conversion layer is higher than the reference resistance in the reset state.

The method may further include comparing the number of applied multiple pulses with a maximum number of pulse applications if the programming result is not verified, applying the multiple pulses again if the number of applied multiple pulses is not equal to the maximum number of pulse applications, and terminating the programming operation if the number of applied multiple pulses is equal to the maximum number of pulse applications.

According to example embodiments, a resistive memory device for programming a resistance conversion layer may include a first and second electrode, a lower structure, and the resistance conversion layer coupled between the first and second electrodes. The resistance conversion layer may be configured to receive multiple pulses, where the multiple pulses include at least two pulses having the same magnitude. A first pulse of the at least two pulses may be applied on one side of the resistance conversion layer through the first electrode and a second pulse of the at least two pulses may be applied on the other side of the resistance conversion layer through the second electrode. The lower structure may be a transistor or a varistor. Also, the lower structure may be a diode and the resistive memory device may further include a third electrode. The resistance conversion layer may be a transition metal oxide layer.

BRIEF DESCRIPTION OF THE DRAWINGS

The above and other features and advantages of example embodiments will become more apparent by describing in detail example embodiments thereof with reference to the attached drawings in which.

DETAILED DESCRIPTION OF EXAMPLE EMBODIMENTS

Figure 1A:
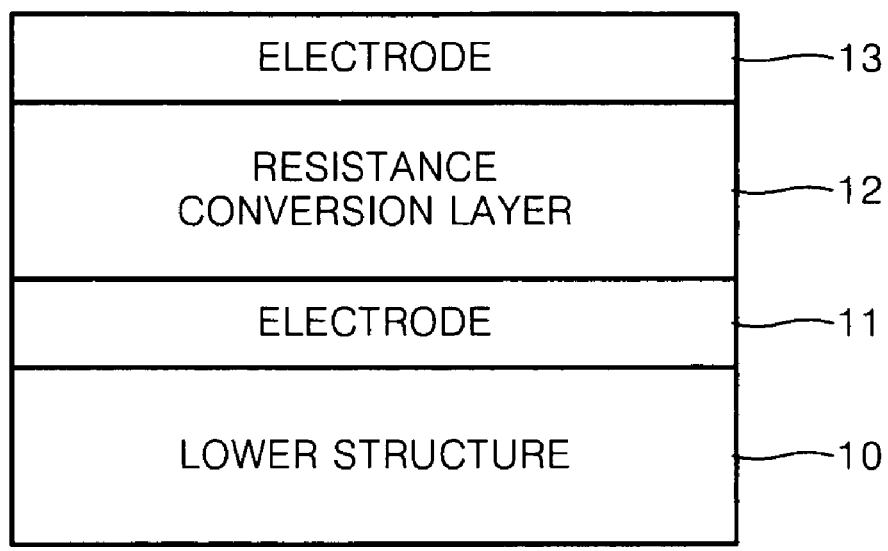
FIGS. 1A and 1B illustrate a cross-sectional view of a resistive memory device according to example embodiments.

Example embodiments will now be described more fully with reference to the accompanying drawings. In the drawings, the thicknesses of layers and regions may be exaggerated for clarity.

Specific structural and functional details disclosed herein are merely representative for purposes of describing example embodiments. Example embodiments may, however, may be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of example embodiments. Like numbers refer to like elements throughout the description of the figures.

It will be understood that, although the terms first, second and third may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1B:
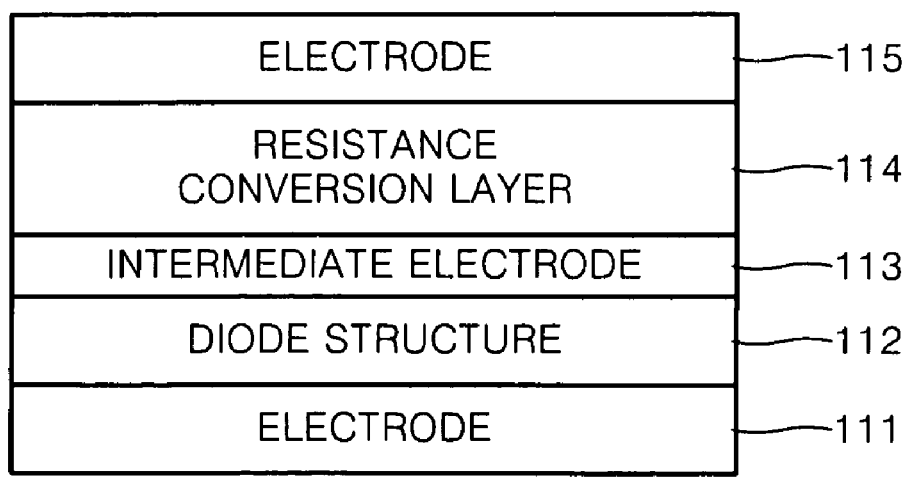

FIGS. 1A and 1B illustrate a cross-sectional view of a resistive memory device according to example embodiments. Referring to FIG. 1A, a unit cell of the resistive memory device may include a first electrode 11, a resistance conversion layer 12, and a second electrode 13 that may be sequentially formed on a lower structure 10. The lower structure 10 may be a switch such as a transistor, a diode, or a varistor, for example.

FIG. 1B illustrates a cross-sectional view of the resistive memory device when the switch is a diode according to example embodiments. Referring to FIG. 1B, the unit cell may include a diode structure 112, an intermediate electrode 113, a resistance conversion layer 114, and an upper electrode 115 that may be sequentially formed on a lower electrode 111. The unit cell may have a cross-point array structure, which the lower electrode 111 is formed in a first direction, the upper electrode 115 is formed in a second direction that may cross the first direction at a right angle, and the diode structure 112, the intermediate electrode 113, and the resistance conversion layer 114 may be formed on a portion where the lower electrode 111 and the upper electrode 115 cross each other.

Referring to FIGS. 1A and 1B, the first electrode 11, the second electrode 13, the lower electrode 111, the intermediate electrode 113, and the upper electrode 115 may be a metal, a metal oxide, a metal nitride, or a doped semiconductor material, for example. The doped semiconductor material may be a conductive material generally used as an electrode in semiconductor devices. Each of the first electrode 11, the second electrode 13, the lower electrode 111, the intermediate electrode 113, and the upper electrode 115 may have a single-layered structure or a multi-layered structure using Al, Cu, Au, Ag, Pt, W, Ir, Ru, TiN, TaN, ZnO, $In_2O_3$, $IrO_2$, $RuO_2$, Si, GaAs, GaN, or SiC, for example.

The resistance conversion layers 12 and 114 may include a material having a variable resistance that varies according to voltages or polarities, and may include a transition metal oxide, PCMO, or STO, for example. The transition metal oxide may be Ni oxide, Ti oxide, Hf oxide, Zr oxide, Zn oxide, Al oxide, W oxide, Co oxide, Cu oxide, Nb oxide, or SrTi oxide, for example.

The diode structure 112 may have a structure having a p-type oxide layer and an n-type oxide layer or a structure having a p-type semiconductor layer and an n-type semiconductor layer, for example.

Figure 2A:
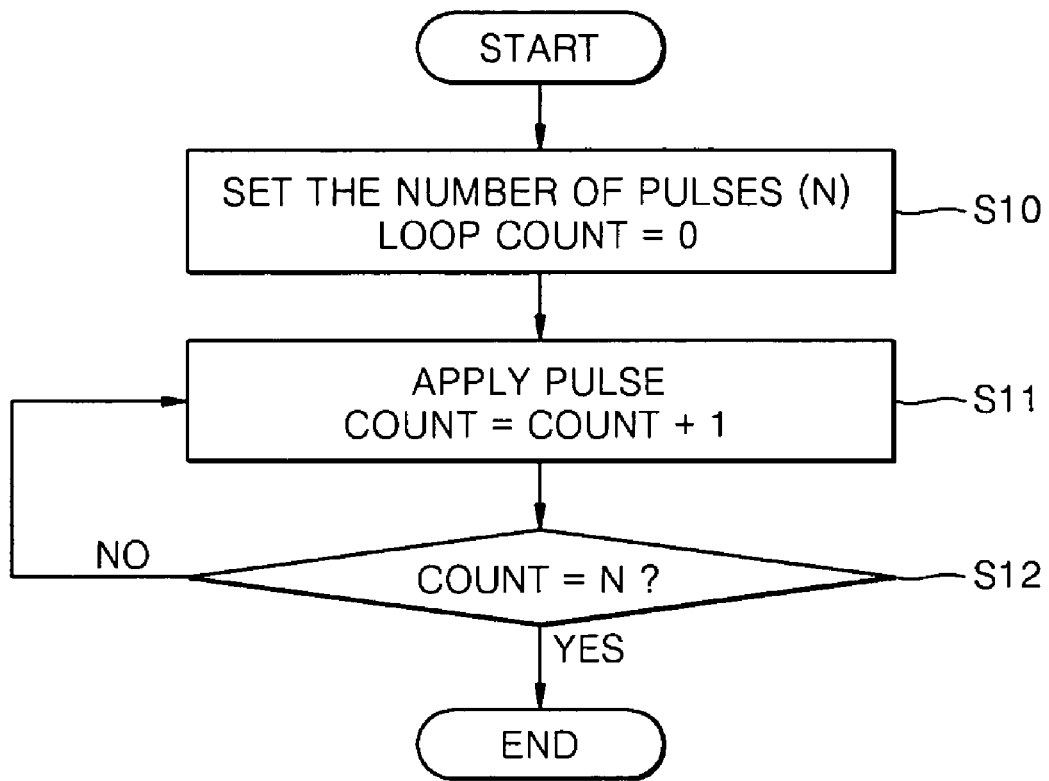
FIG. 2A is a flowchart illustrating a method for programming a resistive memory device according to example embodiments.

FIG. 2A is a flowchart illustrating a method for programming a resistive memory device according to example embodiments. According example embodiments, a set programming operation or a reset programming operation may be performed by applying multiple pulses to the resistive memory device.

Referring to FIG. 2A, in S10, a number of pulse applications N, and a magnitude and a pulse width Pw of the multiple pulses may be set. The multiple pulses may be pulses that are applied to the conversion layer 12 or 114 through electrodes on both sides of the resistance conversion layer 12 or 114. In other words, at least one pulse may be applied to one side of the resistance conversion layer 12 or 114 and at least one pulse may be applied to the other side of the resistance conversion layer 12 or 114. The pulses applied to each side of the resistance conversion layer 12 or 114 may be referred to as the multiple pulses. A magnitude of each pulse of the multiple pulses may be the same. The number of pulse applications N may be set arbitrarily. For example, N may be set from 2 to 10, for example.

In S11, the multiple pulses may be applied to the resistance conversion layer 12 or 114 through electrodes on both sides of the resistance conversion layer 12 or 114. After the multiple pulses are applied, the number of applied multiple pulses may increase by one.

In S12, the set number of pulse applications N may be compared to the number of applied multiple pulses. If the number of applied multiple pulses is not equal to the number of pulse applications N, the multiple pulses may be applied again to the resistance conversion layer 12 or 114 (S11). This process repeats itself until the number of applied multiple pulses is equal to the number of pulse applications N.

Figure 2B:
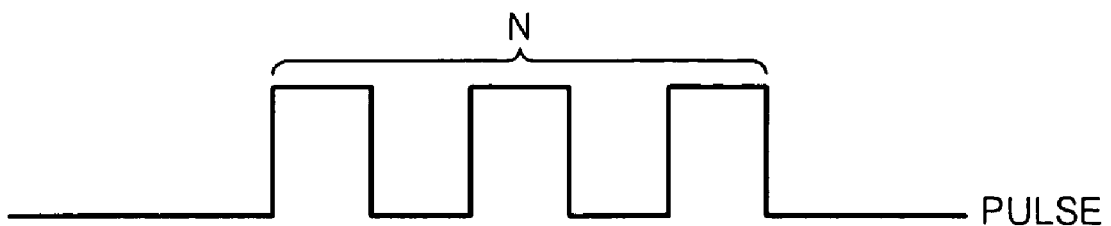
FIG. 2B illustrates a pulse of the multiple pulses being applied three times to the resistance conversion layer according to example embodiments.

FIG. 2B illustrates a pulse of the multiple pulses being applied three times to the resistance conversion layer 12 or 114 according to example embodiments.

The magnitude of the multiple pulses and the number of pulse applications N may be selectively set according to a material of the resistance conversion layer 12 or 114, and a set and reset programming operation.

Figure 3A:
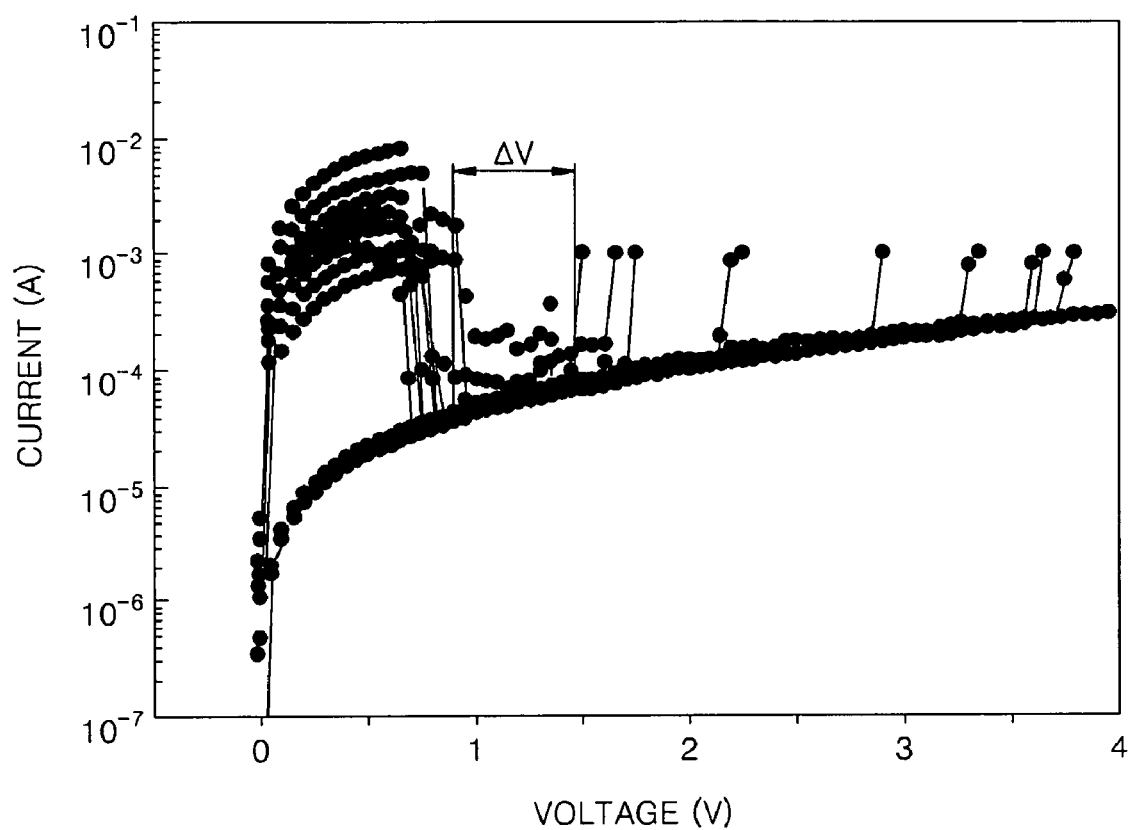
FIG. 3A illustrates a graph showing an electric current with respect to a voltage (V) applied to the resistive memory device according to example embodiments.
Figure 3B:
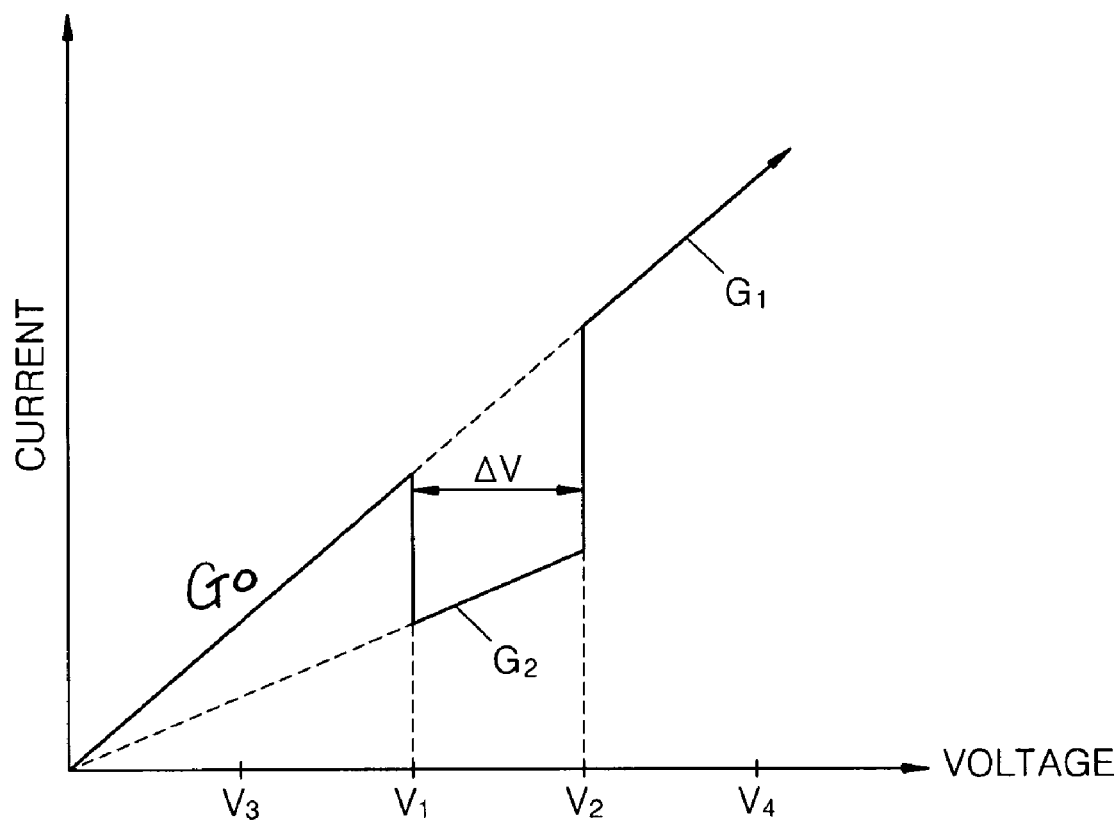
FIG. 3B is a simplified graph of the graph of FIG. 3A according to example embodiments.

FIG. 3A illustrates a graph showing an electric current with respect to a voltage (V) applied to the resistive memory device, in which the resistance conversion layer 12 or 114 includes the Ni oxide material. FIG. 3B is a simplified graph of the graph of FIG. 3A.

Referring to FIGS. 3A and 3B, when the voltage V gradually increases from 0, the electric current flowing in the resistance conversion layer 12 or 114 may gradually increase, as shown by line G0. When the voltage reaches V1, an internal resistance of the resistance conversion layer 12 or 114 suddenly may increase and the electric current flowing in the resistance conversion layer 12 or 114 may decrease, as shown by line G2 (set state→reset state). In addition, when the voltage gradually increases to V2, the internal resistance of the resistance conversion layer 12 or 114 suddenly may decrease, and the current flowing in the resistance conversion layer 12 or 114 may increase, as shown on line G1 (reset state→set state).

As shown in FIG. 3A, the substantial voltages (reset voltages) applied to the resistance conversion layer 12 or 114 when the resistance conversion layer 12 or 114 changes from the set state to the reset state may not be constant, and variations may exist between the substantial reset voltages. For example, when a voltage of 1V is applied, the resistance conversion layer 12 or 114 may change from the set state to the reset state only by one pulse application. However, when a voltage of 0.75V is applied, the resistance conversion layer 12 or 114 might not change to the reset state in some cases.

Figure 4A:
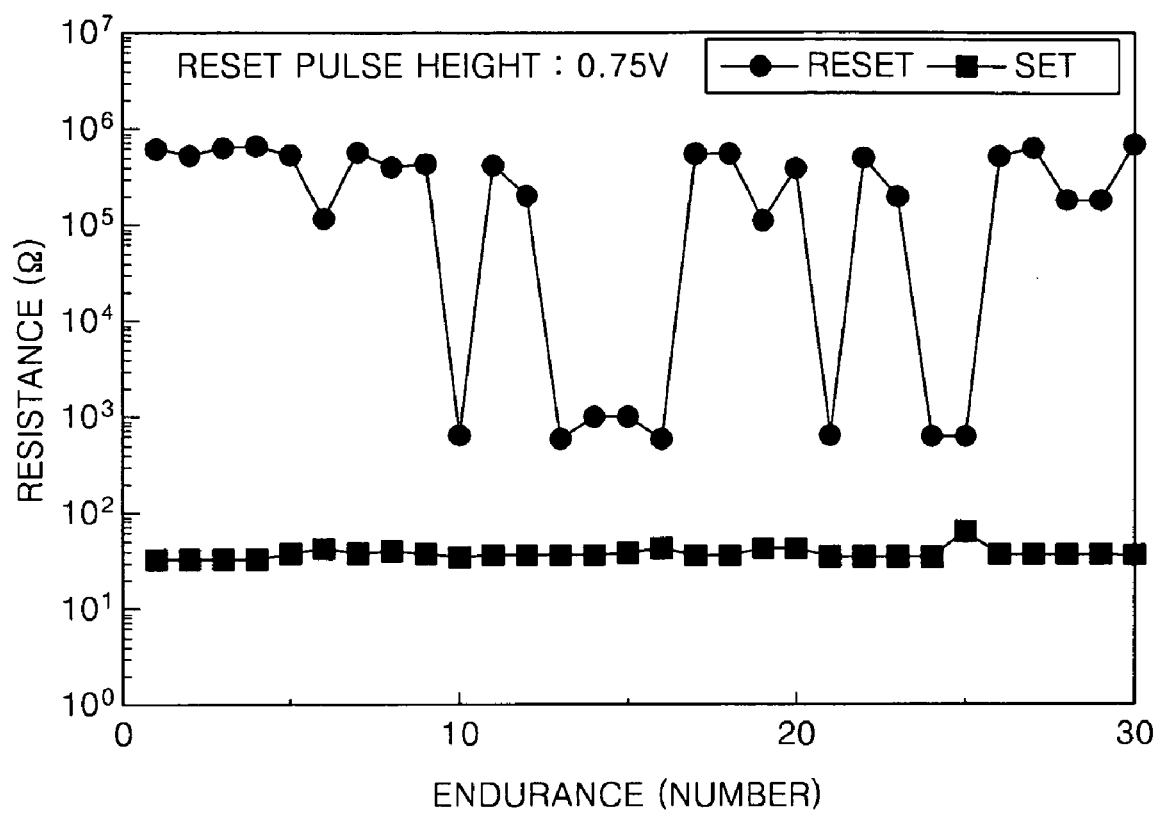
FIG. 4A illustrates the resistance values when a convention single pulse is applied during the reset programming operation.
Figure 4B:
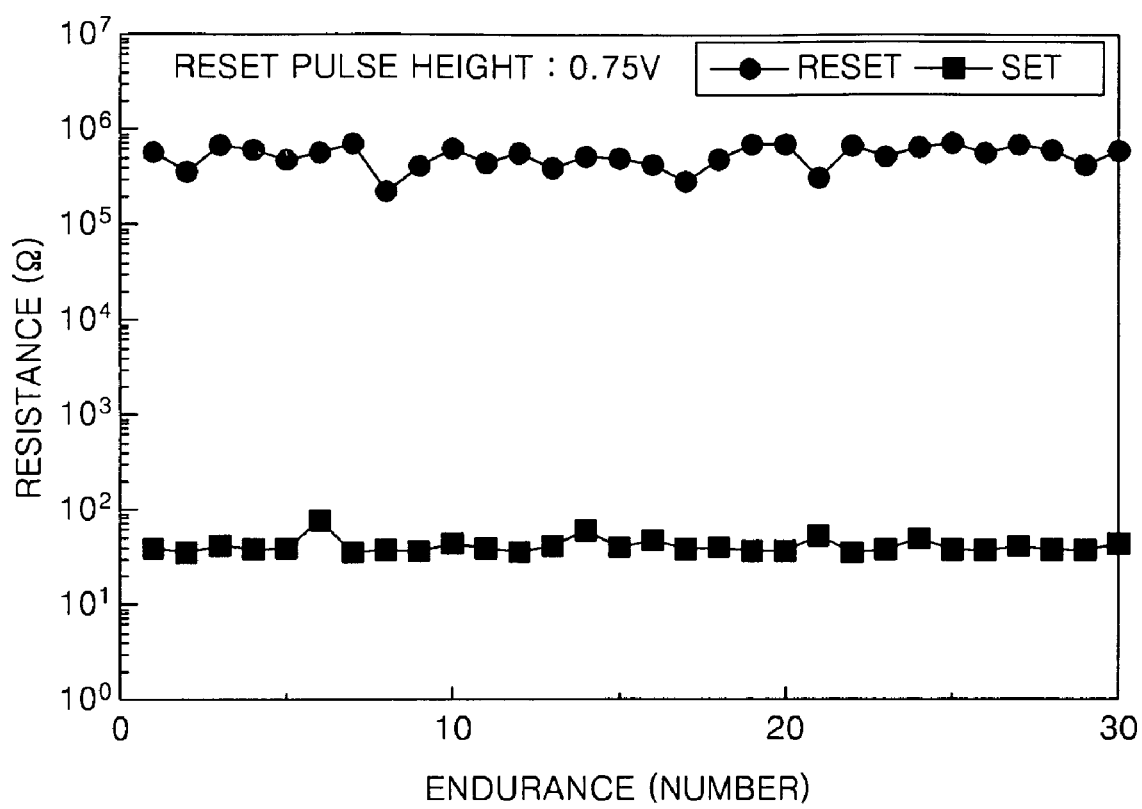
FIG. 4B illustrates the resistance values when multiple pulses are applied five times according to example embodiments.

FIGS. 4A and 4B illustrate graphs showing resistance values of the resistance conversion layer 12 or 114 when a reset pulse of 0.75V is applied to the resistive memory device, in which the resistance conversion layer 12 or 114 is the Ni oxide material. FIG. 4A illustrates the resistance values when a convention single pulse is applied during the reset programming operation, and FIG. 4B illustrates the resistance values when multiple pulses are applied five times according to example embodiments.

Referring to FIG. 4A, when the single pulse is applied to the resistance conversion layer 12 or 114, the resistance of the resistance conversion layer 12 or 114 may not be constant, but may vary. On the other hand, referring to FIG. 4B, when the multiple pulses are applied to the resistance conversion layer 12 or 114, the resistance conversion layer 12 or 114 may change to the reset state from the set state without substantial variations. In addition, when a voltage of the multiple pulses is 0.8V, the resistance conversion layer 12 or 114 may change to the reset state from the set state after applying the multiple pulses three times. That is, when the magnitude of the multiple pulses is reduced, the number of multiple pulses that will be applied may increase.

According to example embodiments, a programming operation may be performed using a small magnitude, and thus, power consumption may be reduced. In addition, referring to FIGS. 3A and 3B, a window (ΔV) may exist between the set programming voltage and the reset programming voltage. When the window increases, the memory device may operate stably. Therefore, when the multiple pulses are used, the stable operation of the memory device may be ensured because the reset pulse of a relatively small magnitude may be used. In addition, in the programming operation for changing the reset state to the set state, the amount of electric current flowing in the memory device may be reduced.

Figure 5A:
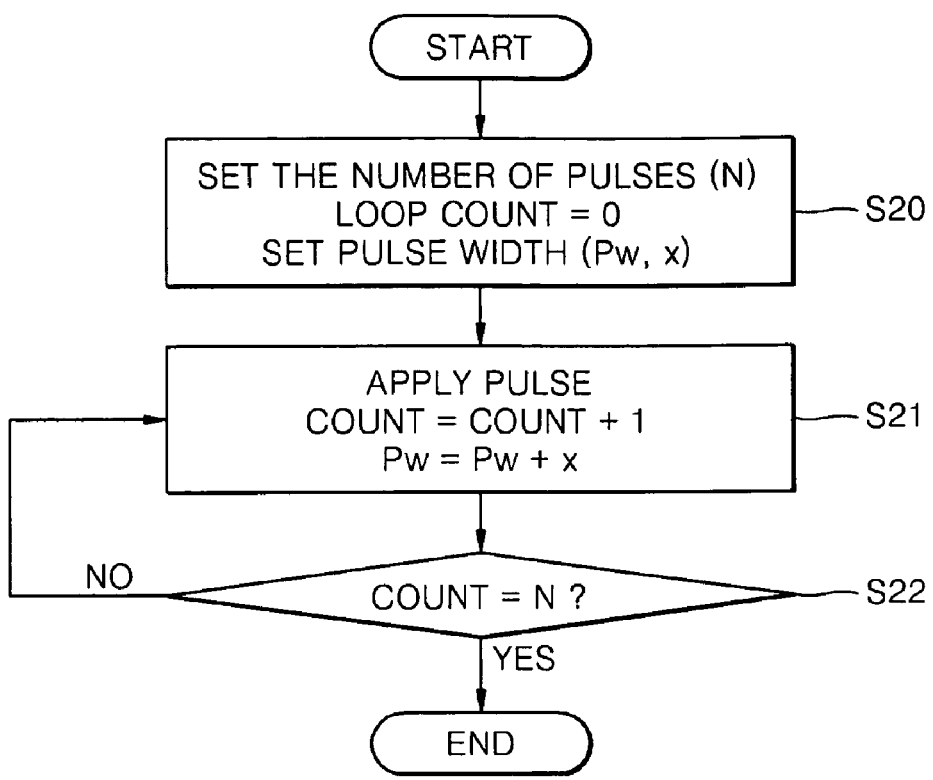
FIG. 5A is a flowchart illustrating a method for programming a resistive memory device according to another example embodiment.

According to another example embodiment, a pulse width Pw of the multiple pulses may be adjusted. FIG. 5A is a flowchart illustrating a method for programming a resistive memory device according to another example embodiment. For instance, the method may further include adjusting the pulse width Pw by an amount x.

Referring to FIG. 5A, in S20, a magnitude of the multiple pulses, the number of pulse applications N, the pulse width Pw of the multiple pulses, and the amount x of the pulse width Pw may be set through both electrodes of the resistance conversion layer 12 or 114. The number of pulse applications N and the amount x may be set arbitrarily. For example, N may be 2 to 10.

In S21, the multiple pulses may be applied to the resistance conversion layer 12 or 114. After the multiple pulses are applied, the pulse width Pw of the multiple pulses may be increased the amount x. In addition, after the multiple pulses are applied, the number of applied multiple pulses may increase by one.

In S22, the set number of pulse applications N may be compared to the number of applied multiple pulses. If the number of applied multiple pulses is not equal to the number of pulse applications N, the multiple pulses may be applied again to the resistance conversion layer 12 or 114 (S21). This process repeats itself until the number of applied multiple pulses is equal to the number of pulse applications N.

Figure 5B:
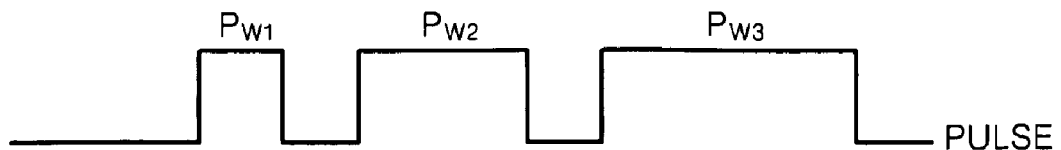
FIG. 5B illustrates a pulse of the multiple pulses when the number of applied multiple pulses is three.

FIG. 5B illustrates a pulse of the multiple pulses when the number of applied multiple pulses is three. For example, when the first multiple pulses are initially set as having a pulse width Pw of 1 ns and the amount x is set as 1 ns, a pulse width Pw of second multiple pulses may be 2 ns and a pulse width of third multiple pulses may be 3 ns.

According to another example embodiment, the method for programming a resistive memory device may include a process for verifying whether an object cell is programmed or not after performing the programming operation.

Figure 6A:
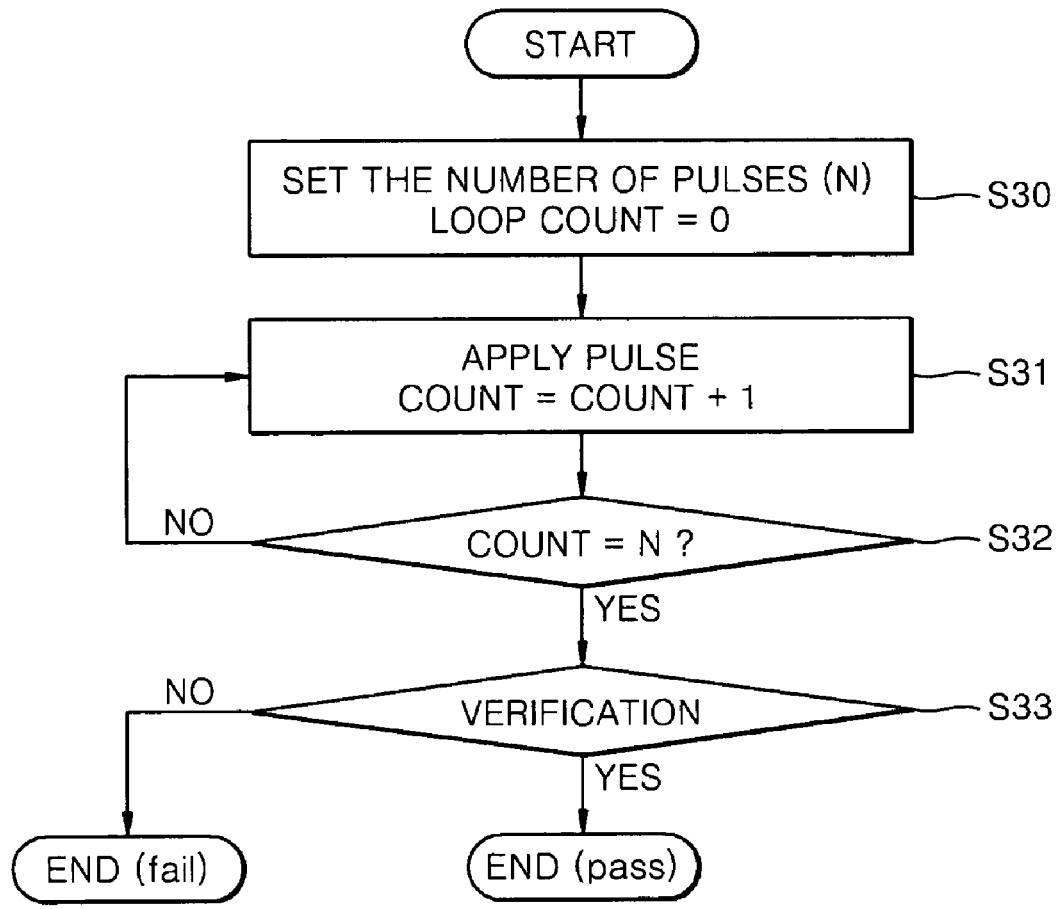
FIG. 6A is a flowchart illustrating a method for programming the resistive memory device according to another example embodiment.

FIG. 6A is a flowchart illustrating a method for programming the resistive memory device according to another example embodiment. For instance, the method may further include verifying whether the resistance conversion layer 12 or 114 is programmed.

Referring to FIG. 6A, in S30, the magnitude of the multiple pulses, the pulse width Pw, and the number of pulse applications N may be set.

In S31, the multiple pulses may be applied to the resistance conversion layer 12 or 114. After the multiple pulses are applied, the number of applied multiple pulses may increase by one.

In S32, the set number of pulse applications N may be compared to the number of applied multiple pulses. If the number of applied multiple pulses is not equal to the number of pulse applications N, the multiple pulses may be applied again to the resistance conversion layer 12 or 114 (S31). This process repeats itself until the number of applied multiple pulses is equal to the number of pulse applications N. If the applied multiple pulses is equal to the set number of pulse applications N, the process continues to the verification stage (S33).

In S33, a programming state of the resistance conversion layer 12 or 114 may be verified. For instance, the verification process may determine whether the resistance conversion layer 12 or 114 is programmed or not. The verification process will be further explained with reference to FIG. 3B.

Referring to FIG. 3B, a voltage V3 that is smaller than the reset voltage V1 may be applied to the resistance conversion layer 12 or 114. Afterwards, a resistance value of the resistance conversion layer 12 or 114 may be measured. If the reset state is programmed, the resistance value of the resistance conversion layer 12 or 114 will be determined according to the line G2. In addition, if the set state is programmed, the resistance value of the resistance conversion layer 12 or 114 will be determined according to the line G1. Therefore, reference resistances in the set state and the reset state may be compared with the resistance value of the resistance conversion layer 12 or 114 to verify the programmed state of the resistance conversion layer 12 or 114. For example, when the reference resistance in the reset state is assumed to be Rr, the reset state may be determined to be programmed if the resistance value of the resistance conversion layer 12 or 114 is higher than the reference resistance Rr. The reference resistance Rr may be set to be lower than the resistance value of the line G2. When the reference resistance of the set state is assumed to be Rs, the set state may be determined to be programmed if the resistance value of the resistance conversion layer 12 or 114 is lower than the reference resistance Rs. The reference resistance Rs may be set to be higher than the resistance value of the line G1. According to the verification result, a result of pass or fail may be output. For instance, if the results of the verification process indicate that the resistance conversion layer 12 or 114 is programmed, a verification pulse Pv may be generated.

Figure 6B:
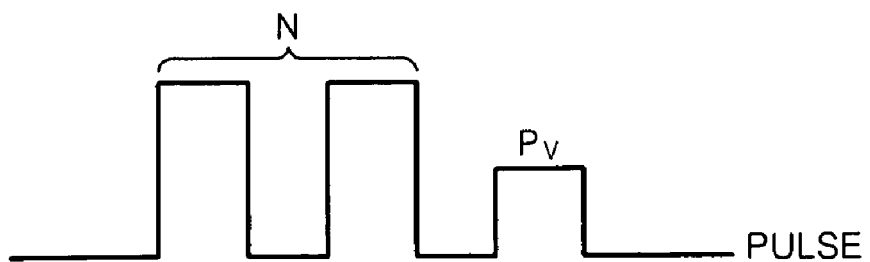
FIG. 6B is a diagram illustrating the verification pulse after the number of applied multiple pulses is two.

FIG. 6B is a diagram illustrating the verification pulse Pv after the number of applied multiple pulses is two.

According to example embodiments, the method for programming the resistive memory device may further include a process for applying the multiple pulses again if the programming of the resistance conversion layer 12 or 114 is not programmed appropriately after the verification stage.

Figure 7A:
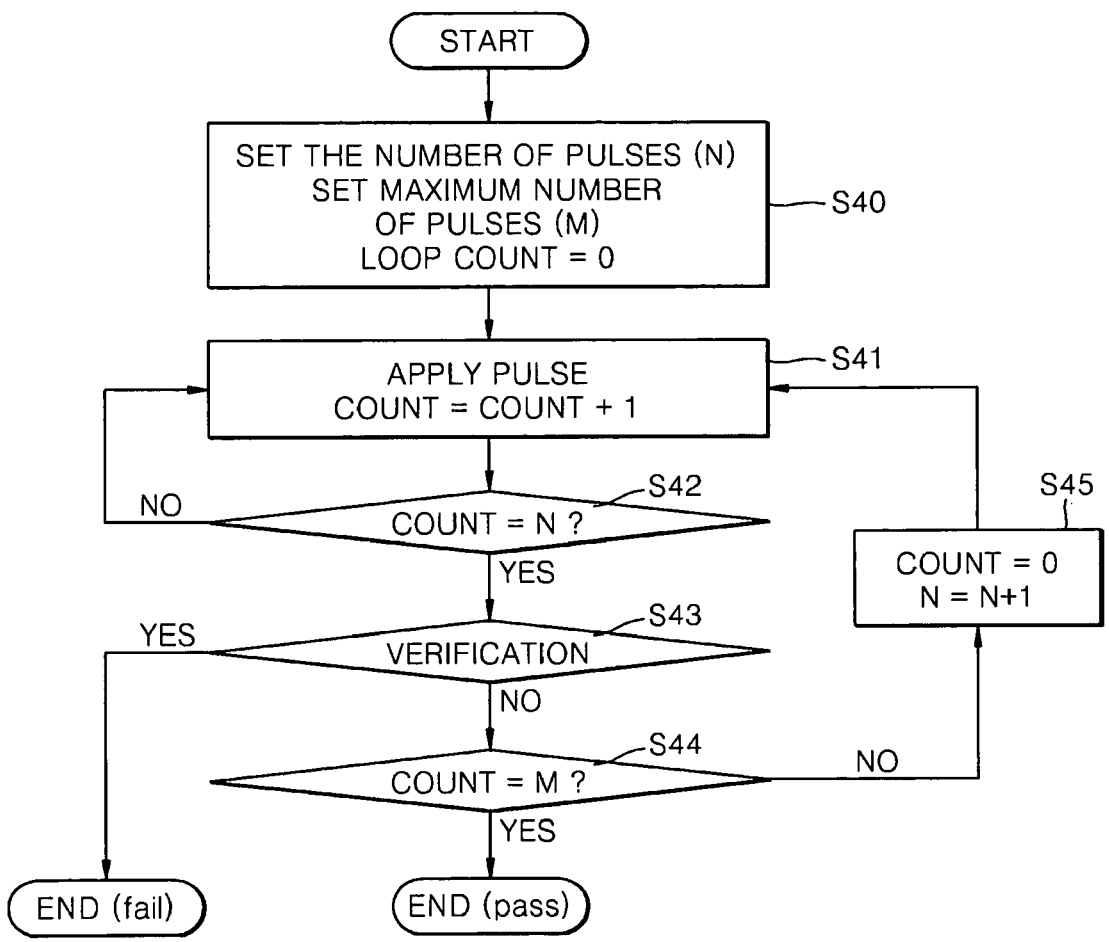
FIG. 7A is a flowchart illustrating a method for programming the resistive memory device according to another example embodiment.

FIG. 7A is a flowchart illustrating a method for programming the resistive memory device according to another example embodiment. For instance, the method may further include applying the multiple pulses again if the programming is not programmed appropriately.

Referring to FIG. 7A, in S40, the magnitude of the multiple pulses, the pulse width Pw, the number of pulse applications N, and a maximum number of pulse applications M may be set. The number of pulse applications N and the maximum number of pulse applications M may be set arbitrary. For example, N may be less than M.

In S41, the multiple pulses may be applied to the resistance conversion layer 12 or 114. After the multiple pulses are applied, the number of applied multiple pulses may increase by one.

In S42, the set number of pulse applications N may be compared to the number of applied multiple pulses. If the number of applied multiple pulses is not equal to the number of pulse applications N, the multiple pulses may be applied again to the resistance conversion layer 12 or 114 (S41). This process repeats itself until the number of applied multiple pulses is equal to the number of pulse applications N. If the applied multiple pulses are equal to the set number of pulse applications N, the process continues to the verification stage (S43).

The verification stage (S43) is the same as the verification stage described in FIG. 6A (e.g., S42) and is omitted for the sake of brevity.

In S44, if the programming of the resistance conversion layer 12 or 114 is performed appropriately, the programming process may be terminated.

In S44, if the programming of the resistance conversion layer 12 or 114 is not performed appropriately, the number of applied multiple pulses may be compared to the maximum number of pulse applications M. If the number of applied multiple pulses is equal to the maximum number of pulse applications M, the programming process may be completed, while outputting a result of fail. If the number of applied multiple pulses is not equal to the maximum number of pulse applications M, the number of applied multiple pulses increases (N=N+1), and the process of applying the multiple pulses (S41) may be performed again (S45).

Figure 7B:
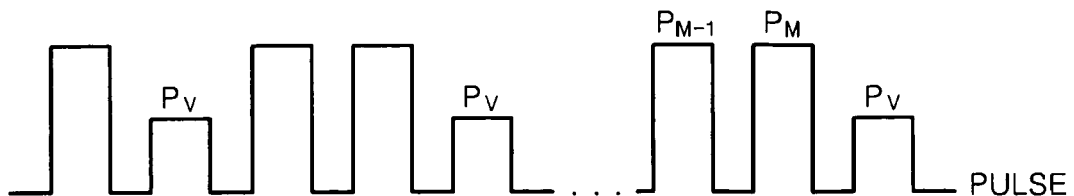
FIG. 7B is a diagram illustrating the multiple pulses when the number of applied multiple pulses is set as 1 at an initial stage.

FIG. 7B is a diagram illustrating the multiple pulses when the number of applied multiple pulses is set as 1 at an initial stage. For instance, the multiple pulses are applied to the resistance conversion layer 12 or 114 once, and then, the verification pulse Pv may be applied (S43) to perform the verification process. If the programming is performed appropriately, the process is over. If the programming is not performed appropriately, the number of applied multiple pulses increases by 1 (N=N+1) (S45), and the multiple pulses are applied again to the resistance conversion layer 12 or 114 (S41). When the resistance conversion layer 12 or 114 is not programmed even when the pulses are applied to the resistance conversion layer 12 or 114 M times, a result of fail may be output and the process may be finished.

According to example embodiments, multiple pulses having constant magnitudes may be applied to the resistive memory device to program unit cells in the resistive memory device. As a result, a scattering of the voltages in the reset programming and the set programming may be stabilized and the resistive memory device may operate reliably. In addition, the width of the multiple pulses may be adjusted and the verification process may be included, where an optimal operation of the resistive memory device may be realized.

While the example embodiments have been shown and described with reference to FIGS. 1-7, it will be understood by one of ordinary skill in the art that various changes in form and details may be made therein without departing from the spirit and scope of the example embodiments as defined by the following claims.

What is claimed is:

1. A method for programming a resistive memory device that includes a resistance conversion layer, the method comprising:
    applying multiple pulses to the resistance conversion layer, the multiple pulses including at least two pulses, a magnitude of each pulse of the at least two pulses being the same;
    comparing a number of applied pulses with a number of pulse applications; and
    applying a pulse again to the resistance conversion layer if the number of applied pulses is not equal to the number of pulse applications, the applied pulse having the same magnitude with that of the multiple pulses.

2. The method of claim 1, wherein a first pulse of the at least two pulses is applied on one side of the resistance conversion layer and a second pulse of the at least two pulses is applied on the other side of the resistance conversion layer.

3. The method claim 1, wherein the applying step is performed during a set programming operation.

4. The method claim 1, wherein the applying step is performed during a reset programming operation.

5. The method of claim 1, further comprising:
    setting the magnitude of the multiple pulses, a pulse width of the multiple pulses, and the number of pulse applications before applying the multiple pulses to the resistance conversion layer.

6. The method of claim 5, wherein the set number of pulse applications is between 2 and 10.

7. The method of claim 5, further comprising:
    terminating the programming operation if the number of applied multiple pulses is equal to the set number of pulse applications.

8. The method of claim 5, further comprising:
    adjusting the pulse width of the multiple pulses by increasing the pulse width by a set amount after the multiple pulses are applied to the resistance conversion layer.

9. The method of claim 5, further comprising:
    verifying a programming result of the resistance conversion layer if the number of applied multiple pulses is equal to the set number of pulse applications.

10. The method of claim 9, wherein the verifying the programming result of the resistance conversion layer includes:
    comparing a resistance of the resistance conversion layer with reference resistances of the resistance conversion layer in a set state and a reset state; and
    generating a verification pulse when the programming result is verified.

11. The method of claim 10, wherein the set state is verified if the resistance of the resistance conversion layer is lower than the reference resistance in the set state, and the reset state is verified if the resistance of the resistance conversion layer is higher than the reference resistance in the reset state.

12. The method of claim 9, further comprising:
    comparing the number of applied multiple pulses with a maximum number of pulse applications if the programming result is not verified;
    applying the multiple pulses again if the number of applied multiple pulses is not equal to the maximum number of pulse applications; and
    terminating the programming operation if the number of applied multiple pulses is equal to the maximum number of pulse applications.

13. A resistive memory device comprising:
    a first and second electrode;
    a lower structure; and
    a resistance conversion layer coupled between the first and second electrodes, wherein multiple pulses are applied to the resistance conversion layer, the multiple pulses include at least two pulses, a magnitude of each pulse of the at least two pulses being the same,
    wherein a number of applied pulses is compared with a number of pulse applications, and a pulse is applied again to the resistance conversion layer if the number of applied pulses is not equal to the number of pulse applications, the applied pulse having the same magnitude with that of the multiple pulses.

14. The resistive memory device of claim 13, wherein the lower structure is a transistor or a varistor.

15. The resistive memory device of claim 13, wherein the lower structure is a diode, and the resistive memory device further includes a third electrode.

16. The resistive memory device of claim 13, wherein the resistance conversion layer is a transition metal oxide layer.

17. The resistive memory device of claim 13, wherein the magnitude of the multiple pulses, a pulse width of the multiple pulses, and the number of pulse applications are set before the multiple pulses are applied.

18. The resistive memory device of claim 17, wherein the resistive memory device is programmed if the number of applied multiple pulses is equal to the set number of pulse applications.

19. The resistive memory device of claim 17, wherein the pulse width of the multiple pulses is adjusted by increasing the pulse width by a set amount after the multiple pulses are applied to the resistance conversion layer.

20. The resistive memory device of claim 17, wherein a programming result of the resistance conversion layer is verified if the number of applied multiple pulses is equal to the set number of pulse applications.

21. The resistive memory device of claim 20, wherein the programming result is verified by comparing a resistance of the resistance conversion layer with reference resistances of the resistance conversion layer in a set state and a reset state.

22. The resistive memory device of claim 21, wherein the set state is verified as programmed if the resistance of the resistance conversion layer is lower than the reference resistance in the set state, and the reset state is verified if the resistance of the resistance conversion layer is higher than the reference resistance in the reset state.

23. The resistive memory device of claim 20, wherein the number of applied multiple pulses is compared with a maximum number of pulse applications if the programming result is not verified, and the multiple pulses is applied again if the number of applied multiple pulses is not equal to the maximum number of pulse applications, wherein the programming operation is terminated if the number of applied multiple pulses is equal to the maximum number of pulse applications.

24. The resistive memory device of claim 13, wherein a first pulse of the at least two pulses is applied on one side of the resistance conversion layer through the first electrode and a second pulse of the at least two pulses is applied on the other side of the resistance conversion layer through the second electrode.

* * * * *